United States Patent
Buer

(10) Patent No.: US 7,339,444 B2
(45) Date of Patent: *Mar. 4, 2008

(54) METHODS FOR PROVIDING BIAS TO A MONOLITHIC MICROWAVE INTEGRATED CIRCUIT

(75) Inventor: Kenneth V Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/458,352

(22) Filed: Jul. 18, 2006

(65) Prior Publication Data

US 2006/0244547 A1 Nov. 2, 2006

Related U.S. Application Data

(63) Continuation of application No. 10/711,306, filed on Sep. 9, 2004, now Pat. No. 7,095,293, which is a continuation of application No. 10/159,420, filed on May 29, 2002, now Pat. No. 6,798,313.

(60) Provisional application No. 60/295,715, filed on Jun. 4, 2001.

(51) Int. Cl.
   *H03H 7/38* (2006.01)
(52) U.S. Cl. .......................... 333/32; 333/30
(58) Field of Classification Search ........... 333/32–100
   See application file for complete search history.

(56) References Cited

U.S. PATENT DOCUMENTS 4,612,520 A  9/1986  Boire et al.

| 5,095,285 A | 3/1992 | Khatibzadeh |
| 5,313,693 A | 5/1994 | Cachier |
| 5,351,001 A | 9/1994 | Kornrumpf et al. |
| 5,355,102 A | 10/1994 | Kornrumpf et al. |

(Continued)

FOREIGN PATENT DOCUMENTS

EP  0949754 A2  10/1999

(Continued)

OTHER PUBLICATIONS

Newman, et al., "A Submillimeter-Wave Planar Diode Mixer Design and Evaluation", Microwave Symposium Digest, 1991, IEEE MIT-S International Boxton, MA, USA Jun. 10-14, 1991, new York, USA, IEEE, US, pp. 1293-1296, XPO10037745.

(Continued)

*Primary Examiner*—Lam T. Mai
(74) *Attorney, Agent, or Firm*—Snell & Wilmer L.L.P.

(57) ABSTRACT

In general, in accordance with an exemplary aspect of the present invention, a method is provided for providing DC bias to an MMIC power amplifier, the method comprising the steps of: attaching a first end of a bond wire directly to a matching structure; and, attaching a second end of a bond wire to a DC bias source. In another exemplary aspect, a method is provided for RF power amplification comprising the steps of: electrically communicating a DC bias to a MMIC power amplifier, wherein the MMIC power amplifier comprises a RF matching structure, and wherein the DC bias is electrically communicated via a bond wire that is coupled directly to the RF matching structure; and, blocking unwanted RF signals with the bond wire.

16 Claims, 5 Drawing Sheets

U.S. PATENT DOCUMENTS

| | | |
|---|---|---|
| 5,387,547 A | 2/1995 | Dougherty et al. |
| 5,449,953 A | 9/1995 | Nathanson et al. |
| 5,574,411 A | 11/1996 | Apel et al. |
| 5,629,241 A | 5/1997 | Matloubian et al. |
| 5,683,919 A | 11/1997 | Tserng |
| 5,757,074 A | 5/1998 | Matloubian et al. |
| 5,844,451 A | 12/1998 | Murphy |
| 5,939,954 A | 8/1999 | Kim et al. |
| 5,990,747 A | 11/1999 | Chaki et al. |
| 6,005,267 A * | 12/1999 | Griffin et al. ............... 257/280 |
| 6,236,070 B1 * | 5/2001 | Griffin et al. ............... 257/192 |
| 6,326,849 B1 | 12/2001 | Wang et al. |
| 6,456,125 B1 | 9/2002 | Miyazawa |
| 6,614,308 B2 * | 9/2003 | Moller et al. ............... 330/295 |
| 6,683,919 B1 | 1/2004 | Olgaard et al. |
| 6,734,728 B1 * | 5/2004 | Leighton et al. ............... 330/66 |
| 6,798,313 B2 | 9/2004 | Buer |
| 2002/0039038 A1 | 4/2002 | Miyazawa |

FOREIGN PATENT DOCUMENTS

| | | |
|---|---|---|
| JP | 2000 082926 A | 3/2000 |
| JP | 2000 82926 A | 3/2000 |
| JP | 2000114824 | 4/2000 |
| WO | WO 99/17367 | 4/1999 |

OTHER PUBLICATIONS

Andre et al.: "Conception, optimisation en regime de forts signaux et reallsation d'un oscillateur MMIC a 10 GHZ" 8EMES Journees Nationales Microondes, May 12, 1993-May 14, 1993 Brest.

* cited by examiner

METHODS FOR PROVIDING BIAS TO A MONOLITHIC MICROWAVE INTEGRATED CIRCUIT

CROSS REFERENCE TO RELATED APPLICATIONS

This application is a continuation of U.S. patent application, Ser. No. 10/711,306, filed Sep. 9, 2004 now U.S. Pat. No. 7,095,293 and is now entitled "METHODS AND DEVICES FOR PROVIDING BIAS TO A MONOLITHIC MICROWAVE INTEGRATED CIRCUIT" which is a continuation of U.S. patent application, Ser. No. 10/159,420, filed May 29, 2002 now U.S. Pat. No. 6,798,313 and is now entitled "MONOLITHIC MICROWAVE INTEGRATED CIRCUIT WITH BONDWIRE AND LANDING ZONE BIAS", which includes subject matter that is related to and claims priority from U.S. Provisional Patent Application Ser. No. 60/295,715, filed Jun. 4, 2001, under the title, "NO BIAS FEED MMIC", all of which are hereby incorporated by reference.

FIELD OF INVENTION

The present invention generally relates to a system for radio frequency ("RF") signal amplification and, in particular, to a MMIC power amplifier. More particularly, the present invention relates to an off-chip DC bias feed system for low cost, high yield, and/or high performance of RF devices.

BACKGROUND OF THE INVENTION

Bias circuitry in various integrated circuits ("IC's") undesirably increases the size and complexity of the IC. In this regard, the cost to produce an IC is generally proportional to the size of the IC. Thus, substantial cost savings may be obtained when a mass produced IC is designed with a smaller chip area. Furthermore, complex IC layouts often take longer to design and unduly restrict the layout of the IC and the layout of devices connecting to the IC.

In various IC's, a substantial portion of the circuitry layout comprises bias feed circuitry. Bias feed circuitry may serve as both a DC power supply path, providing biasing current to transistors on the IC, and as a RF block ("bias choke"). Bias circuitry may become undesirably large in IC's that have high current DC bias and/or high frequency signals. The high current may result in large bias circuitry because the current carrying line is configured to be wide enough to suitably carry the current. Additionally, one or more bias feed line may be incorporated into the chip to share the current carrying duty and thus reduce the width of each bias feed line. With regard to performing the RF blocking function, bias feeds typically require a suitable length trace. In order to fit the bias feed on the chip and maintain a suitable length trace, the traces are often laid out with turns and bends. Unfortunately, wider bias feed lines typically use disproportionately large areas to make turns. Therefore, high power/high frequency IC devices typically have large bias feed sections.

These high power/high frequency characteristics exist in some IC's that amplify high frequency radio frequency ("RF") and microwave signals. One such IC is a monolithic microwave integrated circuit (MMIC) amplifier. A MMIC is typically used to amplify high frequency RF and/or microwave signals. FIG. 1 illustrates a conventional MMIC high power amplifier ("HPA") 100. As is typical, DC bias circuitry areas 190 occupy about 15% to 20% of the total chip area. DC bias circuitry 110 may function as both a DC power supply path to transistors 120 and an RF block ("bias choke"). In high power applications, such as the MMIC, the DC bias circuitry typically employs wide lines, e.g., 112, to accommodate the large current flow to transistors 120. Furthermore, to reduce the line width and/or supply more current, DC bias circuitry 110 is often fed from two sides, e.g., 101 and 102, splitting the current between two lines, e.g., 112 and 113. In addition to the space used to provide current from two sides of a chip, this technique undesirably places restrictions on the next higher level of circuitry to which MMIC 100 is attached. For example, MMIC 100 may be attached to a motherboard having a pair of power lines to the points of connection with the MMIC for providing power to on-chip bias lines 112 and 113.

On-chip capacitors 130 are configured for providing an RF choke. On-chip capacitors 130 are typically located at a 90 degree phase angle length from a matching and combining structure 140. The high impedance line acts as a virtual open to the RF signals, and the on-chip capacitors are configured to short residual RF signals to ground. Bias feed circuit line layouts often have turns in the lines (e.g., 108) to facilitate a suitable RF choke length between capacitors 130 and matching structures 140. However, turns in wide lines generally involve large turning radiuses and more space on the IC. Therefore, prior art bias injection techniques typically involve a lot of bias feed section space on the IC for high frequency and high current applications.

FIG. 2 illustrates the conventional MMIC 200 of FIG. 1 with DC bond wires 220 connecting DC bias circuitry 210 of MMIC 200 to the circuitry of the next higher assembly 250. For example, bond wire 220 is attached to by-pass capacitor 240.

MMICs and other similar devices are now finding applicability in consumer and manufacturing goods and thus, mass production for applications such as broadband home TV and/or internet satellite transmitters, and lasers is desirable. Therefore, it is desirable to reduce the size of the IC layouts and/or to reduce the complexity of IC layouts for more compact applications.

SUMMARY OF THE INVENTION

In general, in accordance with an exemplary aspect of the present invention, a method is provided for providing DC bias to an MMIC power amplifier, the method comprising the steps of: attaching a first end of a bond wire directly to a matching structure; and, attaching a second end of a bond wire to a DC bias source. In another exemplary aspect, a method is provided for RF power amplification comprising the steps of: electrically communicating a DC bias to a MMIC power amplifier, wherein the MMIC power amplifier comprises a RF matching structure, and wherein the DC bias is electrically communicated via a bond wire that is coupled directly to the RF matching structure; and, blocking unwanted RF signals with the bond wire.

BRIEF DESCRIPTION OF THE DRAWING

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

In accordance with one aspect of the present invention, an off-chip bias feed system is configured to power an integrated circuit. In accordance with another aspect of the present invention, the off-chip bias feed system is configured such that the IC layout is smaller in size than an IC, of similar functionality, that receives power through on-chip bias feeds. In accordance with another aspect of the present invention, the IC size may be reduced in IC's which typically use on-chip bias feed circuitry to deliver high current while blocking high frequency signals from the power feed.

High current may be any current level that can create an undesirably wide bias feed line width or, for example, where elimination of the on-chip bias feed section may result in substantial space savings on the IC. The elimination of selected on-chip bias feed circuitry may be advantageously employed for delivery of high current bias feed, however, the off-chip bias feed system may be employed for any current amount of bias feed.

High frequency may include any frequencies high enough to suitably choke the RF signals with a bond wire attached as described herein. For example, high frequency is greater than two GHz, and preferably greater than 20 GHz, and more preferably greater than 30 GHz. The subject matter of the invention is particularly suited for use with K band power amplifiers such as KU and KA bands, although other frequencies may appropriately be used in the invention.

Figure 3:
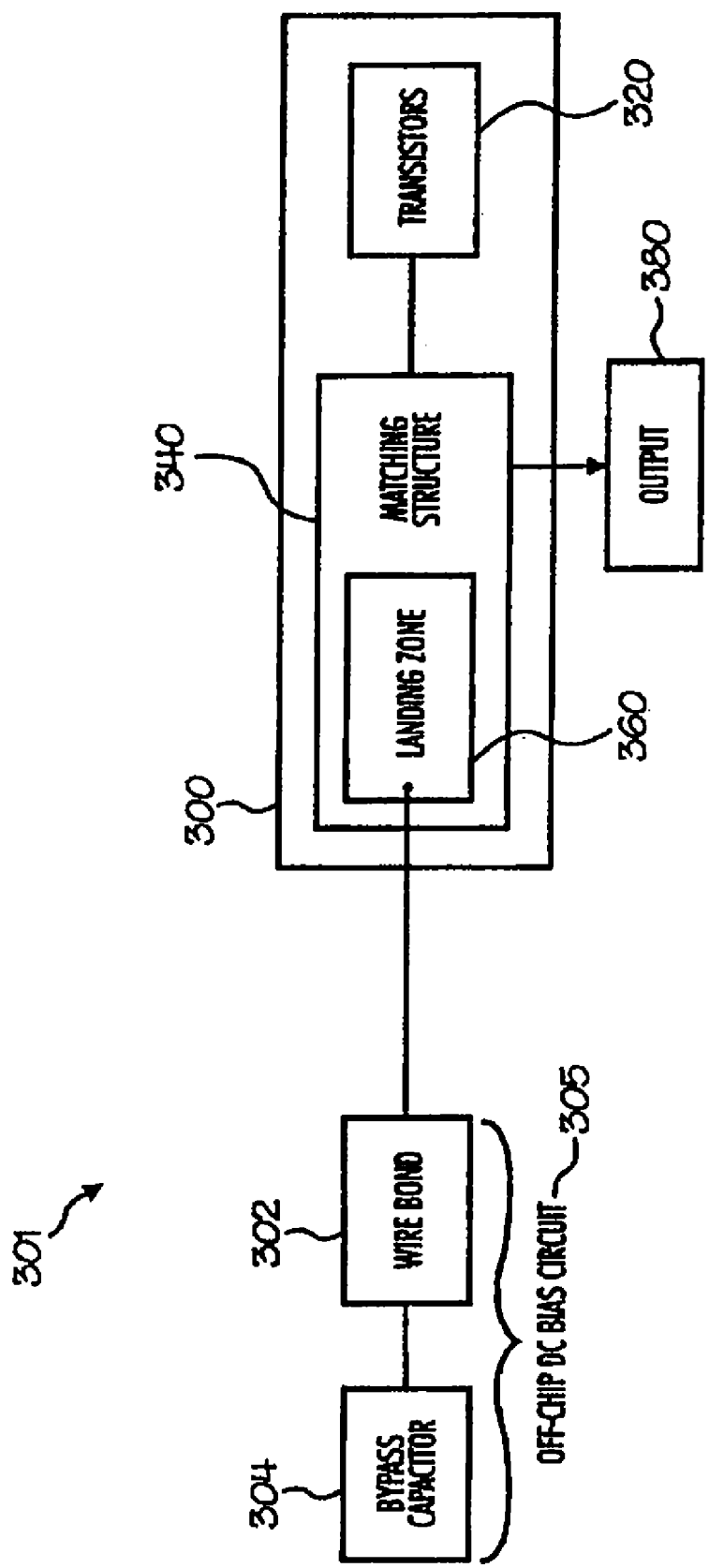
FIG. 3 illustrates an exemplary block diagram of an off-chip bias feed system in accordance with an exemplary embodiment of the present invention.

In an exemplary embodiment of the present invention, FIG. 3 illustrates an off-chip bias feed system 301 comprising an MMIC 300, and an off-chip DC bias stage 305. Furthermore, although one exemplary embodiment of the present invention is described herein with reference to the off-chip bias feed system having a MMIC, MMIC 300 can be any suitable IC used in high frequency signal applications. For example, various IC applications may include power amplifiers, automotive radar, power devices, laser amplifiers, and pin diode switches. These applications can be in any suitable technology area such as digital, analog, electrical, RF, and/or optical areas.

A power amplifier may be fabricated on any suitable MMIC substrate (i.e., chip, die) of a suitable semiconductor material such as silicon (Si), gallium arsenide (GaAs), germanium (Ge), indium phosphide (InP), and combinations such as mixed silicon and germanium, mixed silicon and carbon, and the like. MMIC 300 may be configured to receive bias power directly at one or more landing zone(s) 360.

Landing zones 360 may be suitably selected or designed to receive DC power directly from off-chip bias feed stage 305. For example, landing zones 360 may be selected to be suitably large enough to receive a bond wire. Landing zones 360 may additionally be configured to suitably form a reliable contact with the bond wire. For example, landing zone 360 may be prepared with an ohmic metal for better contact. The metal may be gold, aluminum, copper or the like. In other exemplary embodiments, the landing zone may not be prepared with any special material, and the bond wire may be attached directly to the landing zone material, such as the matching structure. The landing zones may be suitably selected to be areas of low RF impedance.

Landing zones 360 may be located at any suitable location on the IC for making contact with off-chip bias feed stage 305. For example, MMIC 300 may include one or more landing zones 360 in proximity to one or more transistors 320. Transistors 320 may comprise any suitable transistor, such as a field effect transistor, high electron mobility transistor ("HEMT"), bipolar junction transistor ("BJT"), heterojunction bipolar transistors ("HBT"), complementary metal-oxide semiconductor ("CMOS") transistor, and the like. The transistors may be supplied with gate bias, drain bias, and/or the like.

In one exemplary embodiment of the present invention, landing zones 360 may be located on matching structures 340. Matching structure 340 may be configured to have low RF impedance, for example, 10 ohms, and may be configured to electrically connect the bias power to transistors 320. Matching structure 340 may further be configured to electrically connect the RF signal to output 380. Matching structures may be any suitable structure designed to have low RF impedance. Matching strictures may provide a suitable landing target because they are generally large enough to receive a bond wire. The matching structures also are large enough to permit selection from multiple possible landing zones, facilitating landing zone selection. The off-chip bias feed system may thus be configured to not significantly impact the overall RF impedance of the system by placing a high RF impedance bond wire in parallel with a low RF impedance matching structure.

In some instances, a single matching structure may be connected to a single transistor for impedance matching. However, matching structures may also serve to split or combine power to or from the transistors respectively. For example, matching structure 340 may combine power signals received from multiple transistors 320.

Off-chip DC bias stage 305 may comprise one or more DC power supplying bond wire(s) 302 and optionally one or more by-pass capacitor(s) 304. Bond wire 302 is configured to supply bias power to landing zone 360. Bond wire 302 may comprise any suitable conducting material. For example, bond wire 302 may include gold, aluminum, copper, and the like. In one example, bond wire 302 is attached to a by-pass capacitor 304. In other embodiments of the present invention, the by-pass capacitor is omitted. In either embodiment, off-chip bias feed system 301 is configured such that prior art on-chip bias feeds 110 may be selectively eliminated to reduce the size of the IC. Stated another way, the on-chip bias feeds 110 may be made unnecessary through the use of off-chip bias feed system 301.

Figure 4:
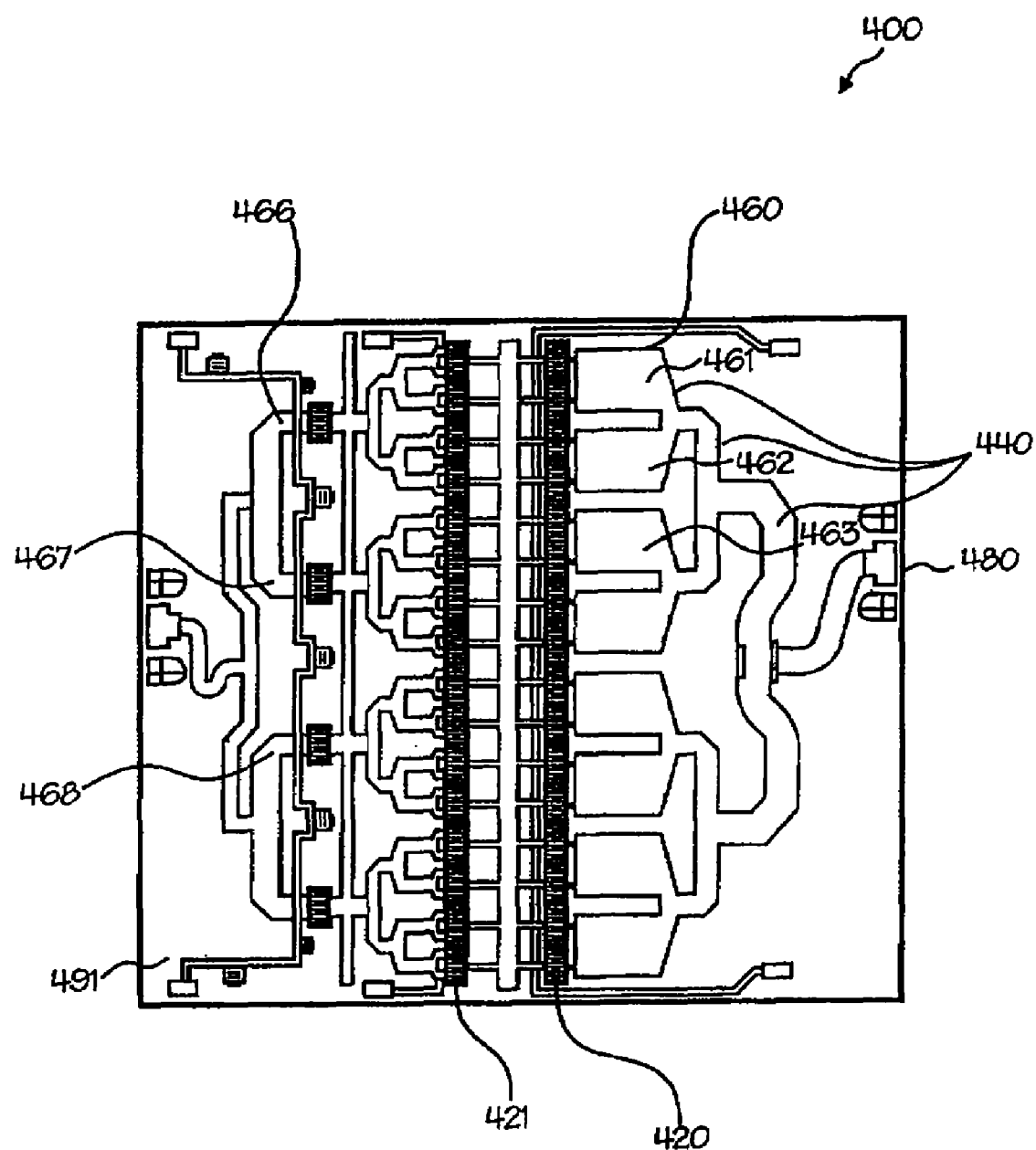
FIG. 4 illustrates an exemplary MMIC layout in accordance with an exemplary embodiment of the present invention.

With reference now to FIG. 4, and in accordance with an exemplary embodiment of the present invention, a MMIC is configured for operations with an off-chip bias feed system. MMIC 400 includes a power amplifier circuit comprising transistors 420 connected to output 480 via matching structure 440. MMIC 400 is constructed on a MMIC substrate 491. MMIC 400 is configured with landing zones 460 on matching structures 440. Furthermore, landing zones 460 may be located in any suitable location on MMIC 400, such as gate or drain pads, transmission lines, or any other suitable structure. Matching structures 440 may already exist, and use of pre-existing matching structures with off-chip bias feed systems facilitates the elimination of some on-chip bias feed circuitry and thus facilitates the use of smaller wafers.

The power to a set of transistors may be delivered via a single landing zone on one branch of matching structure 440 because the matching structures for that set of transistors are interconnected. However, multiple landing zones may suitably share the receiving of power to a set of transistors. For example, MMIC 400 may comprise more than one landing zone (e.g., 461, 462, 463, and/or 466, 467, 468 . . . ) for each set of transistors (e.g., 420 and/or 421). Furthermore, MMIC 400 may be configured to reduce the voltage drop between landing zone 460 and transistors 420. For example, landing zones 460 may be suitably selected in proximity to transistors 420. In this example, reducing the distance traveled by the current may reduce the drop along that path. In addition, voltage drop may be reduced as the on-chip by-pass circuitry distance is reduced by eliminating or by-passing selected on-chip bias circuitry.

Figure 5:
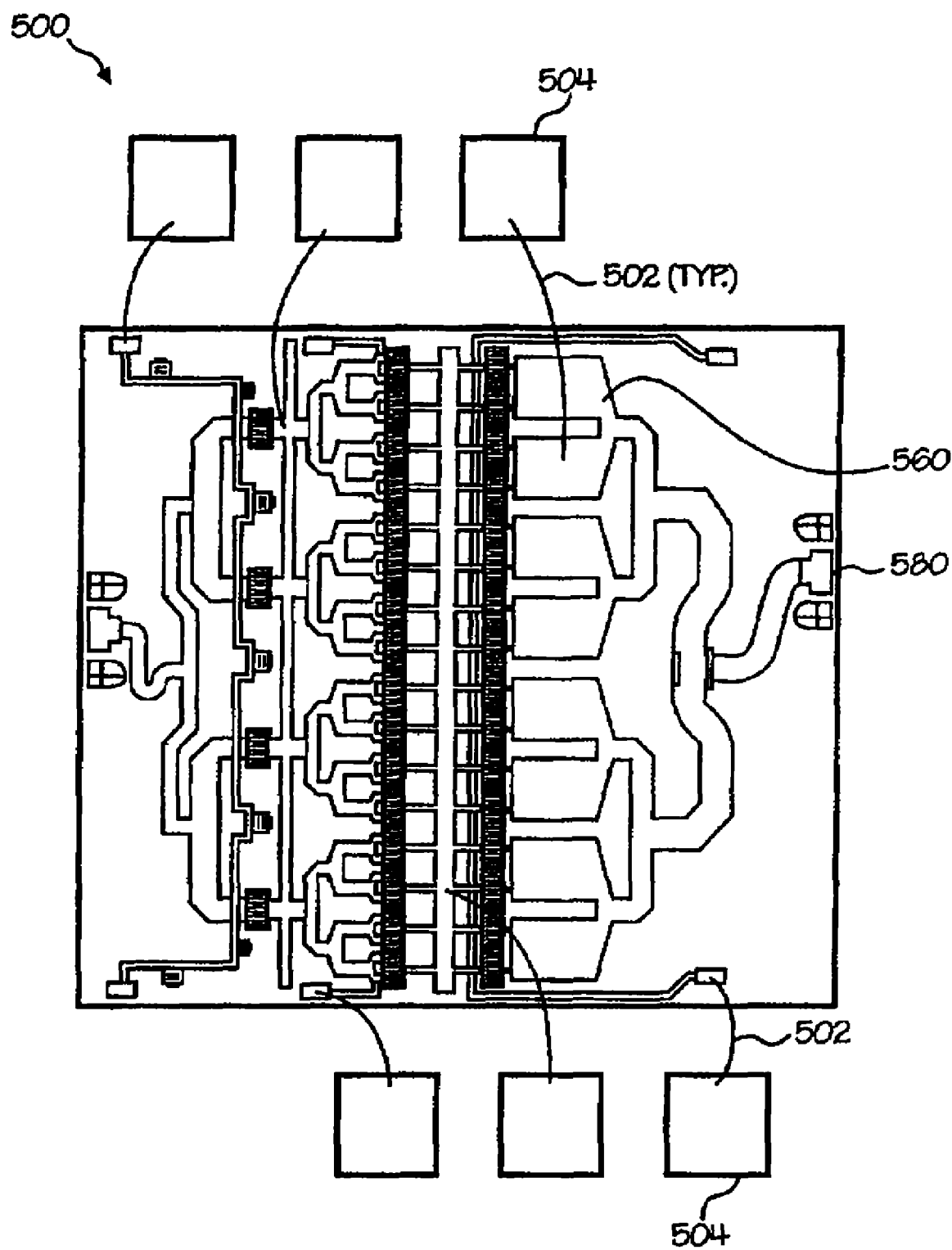
FIG. 5 illustrates an exemplary MMIC layout and off-chip bias feed system in accordance with an exemplary embodiment of the present invention.

With reference now to FIG. 5, MMIC landing zones 560 may be configured to receive bias current directly. For example, MMIC landing zones 560 may be configured to attach to a bond wire 502. Bond wire 502 may be configured to have a larger cross section than the on-chip bias feed lines. Although bond wire 502 may suitably comprise any cross sectional shape, in one exemplary embodiment of the present invention, the cross section is round. In this case, the bond wire may comprise any suitable diameter wire, for example, a 40 micron diameter wire having an area of 1256 square microns. By way of comparison, an exemplary on-chip bias feed line may be 3 microns thick and 100 microns wide, having a cross-sectional area of 300 square microns. In this exemplary embodiment, more current can be carried on the larger cross-sectional area bond wire.

Bond wire 502 may be configured for enhancing high reliability connections. For example, the off-chip bias feed system may comprise a reduced number of bond wire connections. A reduced number of bond wires may be possible because each bond wire can carry more current than the on-chip bias feed lines. Thus, with fewer connections, reliability of bond wire attachments may be improved over on-chip bias feed systems.

Furthermore, the bond wire is configured to enable bias feeding from a single side of the chip. In this case, the current carrying capacity of the bond wire enables sufficient power to be provided to the landing zone along a single path. Alternatively, multiple wires can be attached in parallel to the same general location or to two or more locations. Supplying bias to MMIC 500 from one side of the chip may facilitate greater flexibility at the next higher level of assembly because power is only routed to one side of the chip. Furthermore, the MMIC efficiency may be improved because of the lower voltage drop in the bond wires. For example, use of multiple wires reduces current through each wire thus lowering voltage drop in each bond wire.

The bond wire may be configured to provide the RF impedance that was provided by the on-chip bias circuitry. High RF impedance may be used to create a virtual open. The bond wire may be configured to have any suitable length. In accordance with one aspect of the present invention, the bond wire length is selected to have a high RF impedance value. The bond wire length may then suitably depend on the frequency being blocked. For example, the bond wire may be selected to be a quarter-wave bond wire. The length of an exemplary bond wire may be about 100 mils for a 30 GHz signal. In this case, the length of the bond wire may have a tolerance of, for example, plus or minus 30 mils. In another example, over the range of 20 GHz to 200 GHz, the length of the bond wire may vary from about 0.15 inches to 0.015 inches. The MMIC may be configured to facilitate the appropriate selection of bond wire lengths. For example, MMIC 300 is configured with more than one landing zone providing several possible attachment points and thus enabling the use of any suitable length bond wire. In addition, matching structures may be designed to create strategically located attachment points and suitable landing zones and for creating a high RF impedance bond wire.

The bond wire may be attached in any suitable orientation. In one aspect of the present invention, the bond wire is attached in an orientation that enhances bond wire RF impedance. For example, the bond wire may be attached at a right angle with the surface of the IC. So configured, the bond wire may provide high impedance virtual open to RF frequencies. In another exemplary embodiment of the present invention, the bond wire is attached at an angle to the surface of the IC.

The bond wire, thus configured in the air, may have a relatively high Q ratio. Q is a ratio of loss, reactance divided by resistance, where as Q increases, matching losses decrease. Q may represent the amount of RF that leaks past the virtual RF open presented at the matching structure by the bond wire. Therefore, a bond wire presenting a high Q ratio to the matching structure facilitates the use of the bond wire as a suitable RF choke. The virtual open may choke substantially all of the RF signal, although a small portion of the RF may leak past. For example, the Q of an average on-chip MMIC may be around 100, whereas in the off-chip bias feed system, the Q of the bond wire may be as high as 1000 or more.

In one exemplary embodiment of the present invention, one end of the bond wire is attached to the MMIC at the landing zone and the other end of the bond wire is attached to any suitable off-chip connection point, e.g. off-chip capacitor. In accordance with one aspect of the present invention, an off-chip capacitor may provide an RF short which substantially prevents stray RF signals from interfering with the rest of the power supply system. However, the RF short may not be needed under some circumstances, such as, when the bond wire impedance is sufficiently high. Advantageously, existing by-pass capacitors may be used as the off-chip capacitors, and thus use no additional components.

Figure 1:
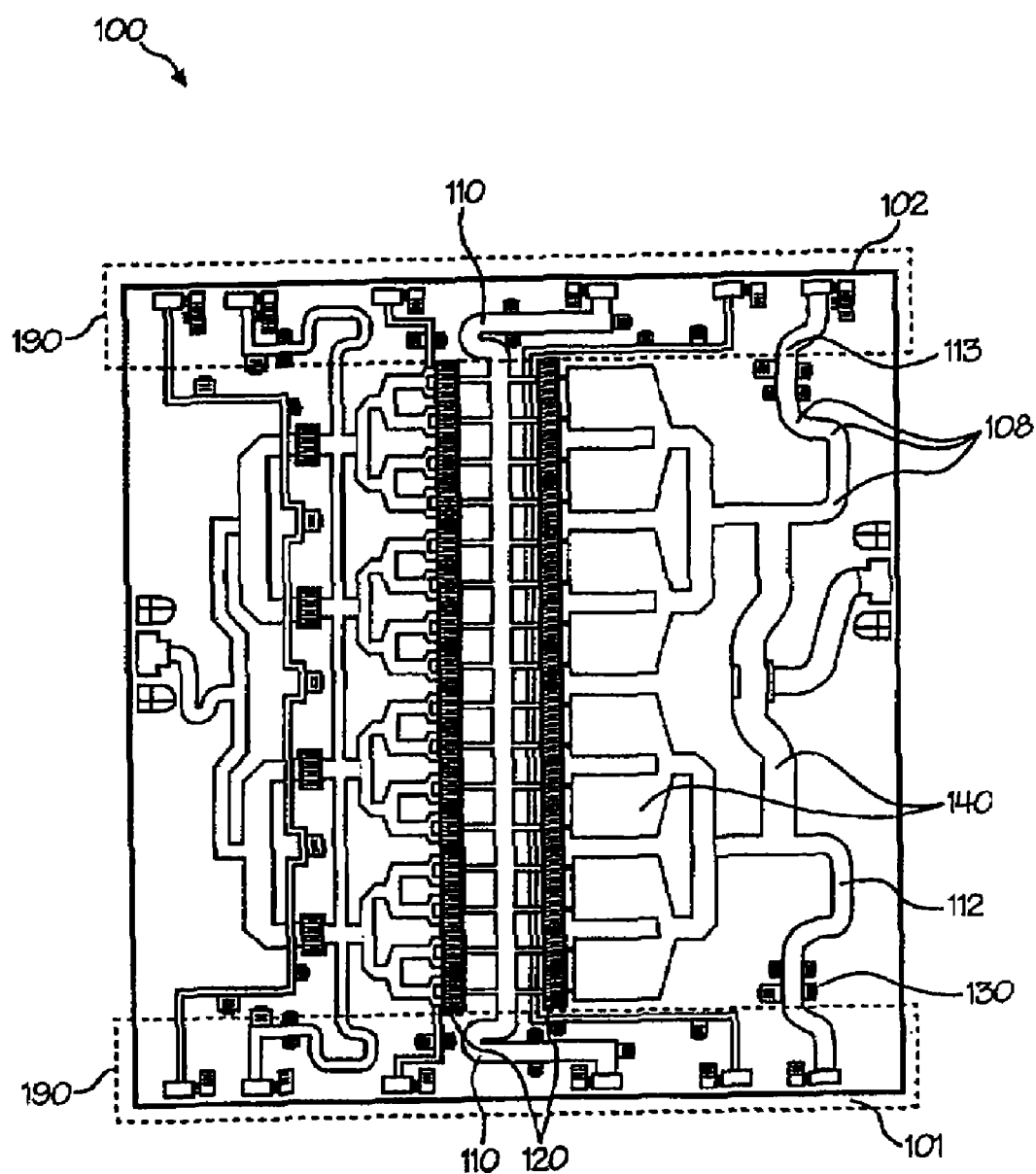
FIGS. 1 and 2 illustrate, schematically, a conventional MMIC amplifier.
Figure 2:
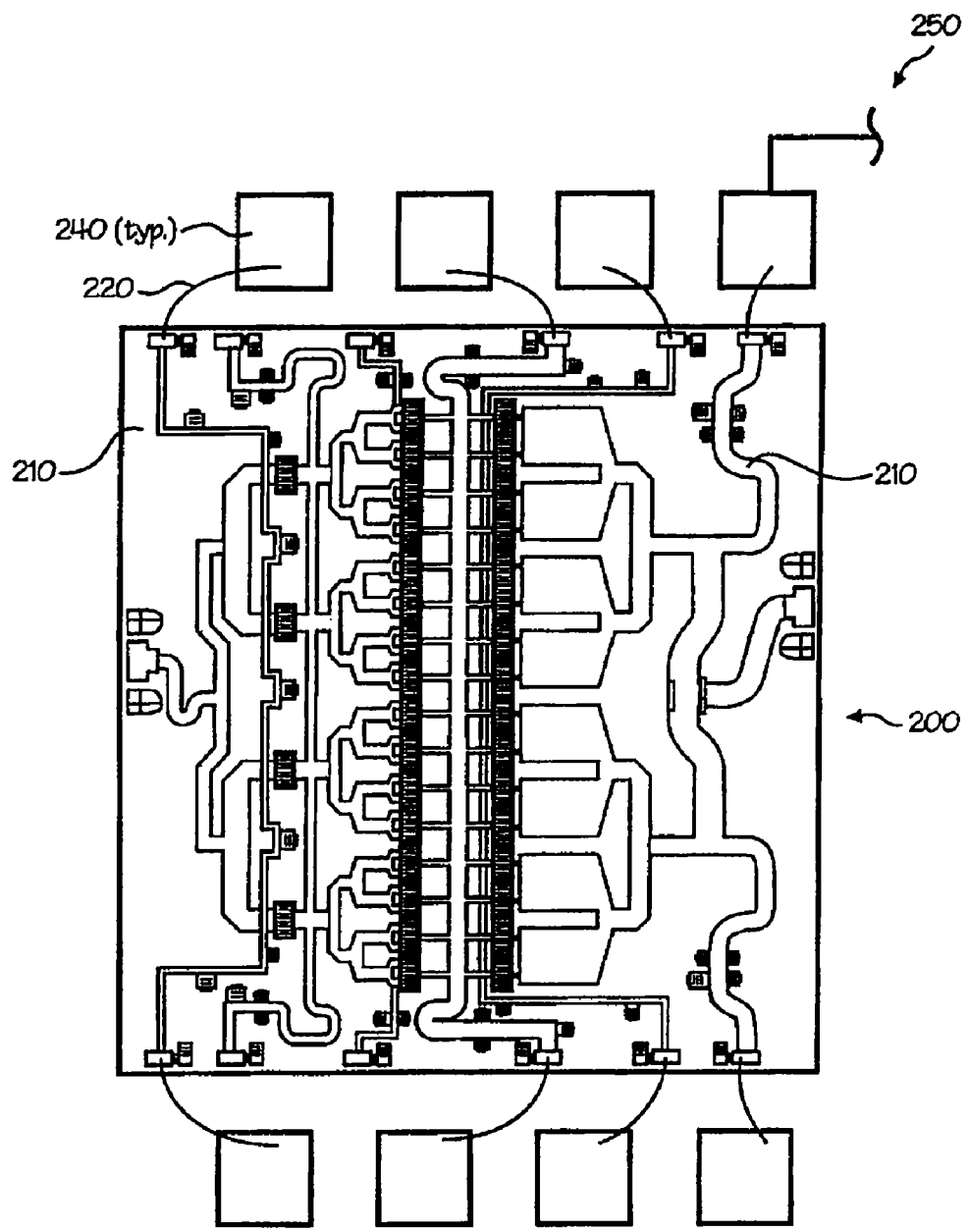

As previously stated, absence of on-chip bias feed circuitry may reduce the overall size of the MMIC. Exemplary power amplifier 500 may include, for example, a two mil thick Gallium Arsenide MMIC amplifier which is approximately 21.4 mm^2 (5.35 mm×4.0 mm). In contrast, a conventional MMIC power amplifier may have a die size of approximately 25.14 mm^2 (5.35 mm×4.7 mm). Thus, the MMIC power amplifier in accordance with the systems and methods of the invention has about a 15% reduced size over the conventional MMIC power amplifier without loss of functionality. In other embodiments, the size reduction may be greater or less than 15%. For example, much of the circuitry within areas 190, as illustrated in FIG. 1, may be eliminated and some of the circuitry may be rearranged to eliminate some or all of the chip areas 190.

The reduced die size of the invention facilitates easier handling and assembly of the die. Also, a reduction in the die size may allow more die to be manufactured on a single wafer and may reduce the cost of manufacture and/or allow added functionality to the chip without the use of additional chip area. Additionally, smaller die area decreases the probability of random die defects within the die itself and reduces the chance of solder voids in the attach process. The relatively thin 2-mil die (i.e., 50 μm) is extremely susceptible to breakage, and as the die area increases, the chance of breakage increases. The use of smaller die may facilitate the use of smaller motherboards in smaller devices. One skilled in the art will readily recognize the benefits of the reduced die size facilitated by the invention including, but not limited to, the improved production yield when using a thin die. Some of the advantages of the invention are herein described with respect to a 2-mil die, for among the same and other reasons, it should be appreciated that the present invention is equally as advantageous for other die sizes (e.g., 1-mil, 4-mil, 8-mil, and the like).

Although the present invention is described in terms of reducing the size of an IC layout while maintaining the same functionality and without reducing the performance of the IC, it is not so limited. For example, various embodiments of the present invention may have the same size IC layout as prior art layouts, but with additional functionality. In general, the off-chip bias feed system of the present invention enables the same functionality of on-chip bias feed circuitry without the on-chip bias feed circuitry.

It should be appreciated that the particular implementations shown and described herein are illustrative of various embodiments of the invention including its best mode, and are not intended to limit the scope of the present invention in any way. For example, the systems and methods for MMIC power amplifiers described herein were described with respect to FETs, however various other active devices may be equally as suitable. For the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

While the principles of the invention have now been made clear in illustrative embodiments, there will be immediately obvious to those skilled in the art many modifications of structure, arrangements, proportions, the elements, materials and components, used in the practice of the invention which are particularly adapted for a specific environment and operating requirements without departing from those principles. These and other changes or modifications are intended to be included within the scope of the present invention, as expressed in the following claims.

What is claimed is:

1. A method for providing DC bias to an MMIC power amplifier, the method comprising the steps of:
    attaching a first end of a bond wire directly to a matching structure; and,
    attaching a second end of the bond wire to a DC bias source, wherein the bond wire is configured to have an impedance greater than 50 ohms.

2. The method of claim 1 wherein the impedance of the bond wire is configured to act as a virtual open circuit at RF and microwave frequencies.

3. A method for providing DC bias to an MMIC power amplifier, the method comprising the steps of:
    attaching a first end of a bond wire directly to a matching structure;
    attaching a second end of the bond wire to a DC bias source; and
    preparing the matching structure with an ohmic metal configured to facilitate an electrical connection with the bond wire.

4. A method for providing DC bias to an MMIC power amplifier, the method comprising the steps of:
    attaching a first end of a bond wire directly to a matching structure; and
    attaching a second end of the bond wire to a DC bias source, wherein the DC bias source comprises a by-pass capacitor.

5. The method of claim 4 further comprising the step of attaching the second end of the bond wire to a first end of the by-pass capacitor, and attaching a second end of the by-pass capacitor to the DC bias source, wherein the by-pass capacitor is located on a different chip than the matching structure.

6. A method for providing DC bias to an MMIC power amplifier, the method comprising the steps of:
    attaching a first end of a bond wire directly to a matching structure; and
    attaching a second end of the bond wire to a DC bias source, wherein the bond wire is configured to be a quarter wave transmission line.

7. The method of claim 6 wherein the bond wire is less than 150 mils long and approximately a 90 degree phase length at the frequency of operation.

8. A method of RF power amplification comprising the steps of:
    electrically communicating a DC bias to a MMIC power amplifier,
        wherein the MMIC power amplifier comprises a RF matching structure, and wherein the DC bias is electrically communicated to said RF matching structure via a bond wire that is coupled directly to the RF matching structure; and,
    blocking unwanted RF signals with the bond wire.

9. The method of claim 8 wherein the blocking step further comprises blocking unwanted RF signals with the high impedance of the bond wire.

10. The method of claim 8 wherein the bond wire is less than 150 mils long and approximately a 90 degree phase length at the frequency of operation.

11. The method of claim 8 wherein the matching structure comprises an ohmic metal configured to facilitate an electrical connection with the bond wire.

12. The method of claim 8 wherein the bond wire is configured to be a quarter wave transmission line.

13. The method of claim 8 wherein the matching structure is located within an interior portion of the MMIC power amplifier and comprises an ohmic material that is configured to facilitate receiving the bond wire.

14. The method of claim 8 wherein the step of electrically communicating DC bias to the MMIC power amplifier further comprises the step of communicating the DC bias to a by-pass capacitor, and further communicating the DC bias from the by-pass capacitor to the bond wire, wherein the by-pass capacitor is located on a different chip that the matching structure.

15. The method of claim 14 wherein the bond wire is configured to have an impedance greater than 50 ohms.

16. The method of claim 14 wherein the high impedance of the bond wire is configured to act as a virtual open circuit at RF and microwave frequencies.

* * * * *